United States Patent
Yamamoto et al.

[11] Patent Number: 5,821,601
[45] Date of Patent: Oct. 13, 1998

[54] BIPOLAR SEMICONDUCTOR INTEGRATED CIRCUIT WITH A PROTECTION CIRCUIT

[75] Inventors: Masahiro Yamamoto; Yukio Yasuda, both of Tokyo, Japan

[73] Assignee: Mitsubishi Denki Kabushiki Kaisha, Tokyo, Japan

[21] Appl. No.: 796,547

[22] Filed: Feb. 6, 1997

[30] Foreign Application Priority Data

Sep. 5, 1996 [JP] Japan .................................. 8-234942

[51] Int. Cl.$^6$ .................................................. H01L 23/60
[52] U.S. Cl. .................... 257/579; 257/546; 257/557; 257/593; 257/545
[58] Field of Search .................... 257/546, 557, 257/593, 579, 487, 545

[56] References Cited

U.S. PATENT DOCUMENTS 5,151,767  9/1992  Wong .
5,604,373  2/1997  Susak et al. ............................. 257/546

FOREIGN PATENT DOCUMENTS 4321773  11/1912  Japan .
63-39194  2/1988  Japan .
5129532  5/1993  Japan .

Primary Examiner—Carl W. Whitehead, Jr.

[57] ABSTRACT

A bipolar semiconductor integrated circuit has a pnp transistor through which a DC power is supplied from an external DC power to various elements of the bipolar IC and a constant current circuit for turning the pnp transistor on and regulating the base current of the pnp transistor to a constant level causing operation in the saturation range of the pnp transistor.

4 Claims, 6 Drawing Sheets

BIPOLAR SEMICONDUCTOR INTEGRATED CIRCUIT WITH A PROTECTION CIRCUIT

BACKGROUND OF THE INVENTION

1. Field of the Invention

The present invention relates to a semiconductor integrated circuit, and relates particularly to a circuit for protecting against a reverse-polarity connection of the power supply in a semiconductor integrated circuit made from a bipolar IC.

2. Description of the Prior Art

FIG. 10 is a circuit diagram of part of a prior art semiconductor integrated circuit (IC). In the bipolar semiconductor IC 80 shown in FIG. 10, the collector of an npn transistor 81 is connected to the power supply terminal Vcc to which an external dc source is connected, and the emitter of this npn transistor 81 is grounded through a p diffused resistor 82. The base of the npn transistor 81 is connected to the bases of pnp transistors 83 and 84, and the emitters of said pnp transistors 83 and 84 are connected to the power supply terminal Vcc. The base and collector of the pnp transistors 83 and 84 are grounded.

What happens with the circuit shown in FIG. 10 when a dc power supply is connected with the polarity reversed is described below.

FIG. 11 is a cross section of the semiconductor chip including the npn transistor 81 when a dc power supply is connected with the polarity reversed. As shown in FIG. 11 the npn transistor 81 includes an n$^+$ implantation layer 91 and an n$^-$ epitaxial layer 92 formed in a p silicon substrate 90, a p diffusion layer 93 forming the base, an n$^+$ diffusion layer 94 forming the emitter, and an n$^+$ diffusion layer 95 forming the contact of the collector. The n$^-$ epitaxial layer 92 and n$^+$ diffusion layer 95 form the collector.

The p silicon substrate 90 and the n region formed by the n$^+$ implantation layer 91, n$^-$ epitaxial layer 92, and n$^+$ diffusion layer 95 form a pn junction diode. In this diode, the p silicon substrate 90 is the anode and the n region is the cathode, creating a forward biased diode from p silicon substrate 90 to n$^+$ diffusion layer 95. When a dc power supply is connected with the polarity reversed, the p silicon substrate 90 is connected to the power supply terminal Vcc and the n$^+$ diffusion layer 95 is grounded. This results in the power supply terminal Vcc being grounded inside the bipolar semiconductor IC 80 and the bipolar semiconductor IC 80 being damaged.

FIG. 12 is a cross section of the semiconductor chip area of the p diffused resistor 82 when a dc power supply is connected with the polarity reversed. As shown in FIG. 12 the p diffused resistor 82 includes an n$^+$ implantation layer 96 and an n$^-$ epitaxial layer 97 formed in a p silicon substrate 90, a p diffusion layer 98 forming the resistor, and an n$^+$ diffusion layer 99. The p silicon substrate 90 and the n region formed by the n$^+$ implantation layer 96, n$^-$ epitaxial layer 97, and n$^+$ diffusion layer 99 form a pn junction diode.

In this diode the p silicon substrate 90 is the anode and the n region formed by the n$^+$ implantation layer 96, n$^-$ epitaxial layer 97, and n$^+$ diffusion layer 99 is the cathode, creating a forward biased diode from p silicon substrate 90 to n$^+$ diffusion layer 99. When a dc power supply is connected with the polarity reversed, the p silicon substrate 90 is connected to the power supply terminal Vcc and the n$^+$ diffusion layer 99 is grounded. This results in the power supply terminal Vcc being grounded inside the bipolar semiconductor IC 80 and the bipolar semiconductor IC 80 being damaged.

SUMMARY OF THE INVENTION

The object of the present invention is therefore to resolve the above problems to achieve a semiconductor integrated circuit which will not be destroyed or damaged when a dc power supply is connected with the polarity reversed, as may occur, for example, when charging an automobile battery.

To achieve the above object a semiconductor integrated circuit according to the present invention is a bipolar semiconductor integrated circuit wherein a dc power supply supplied from an external source is supplied to each element of a bipolar integrated circuit through a pnp transistor which functions to prevent damage to the elements when a base current of a level causing operation in the saturation range is supplied and the dc power supply is connected in reverse polarity.

More specifically, the pnp transistor supplies the dc power supply from an external source to the n region of a p diffused resistor and to the collector of an npn transistor of the bipolar IC.

The pnp transistor may also be provided in the bipolar IC and a constant current supply may be connected to the base of the pnp transistor.

A collector wall may also be disposed as the pnp transistor.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of the present invention are described below with reference to the accompanying figures.

Embodiment 1

Figure 1:
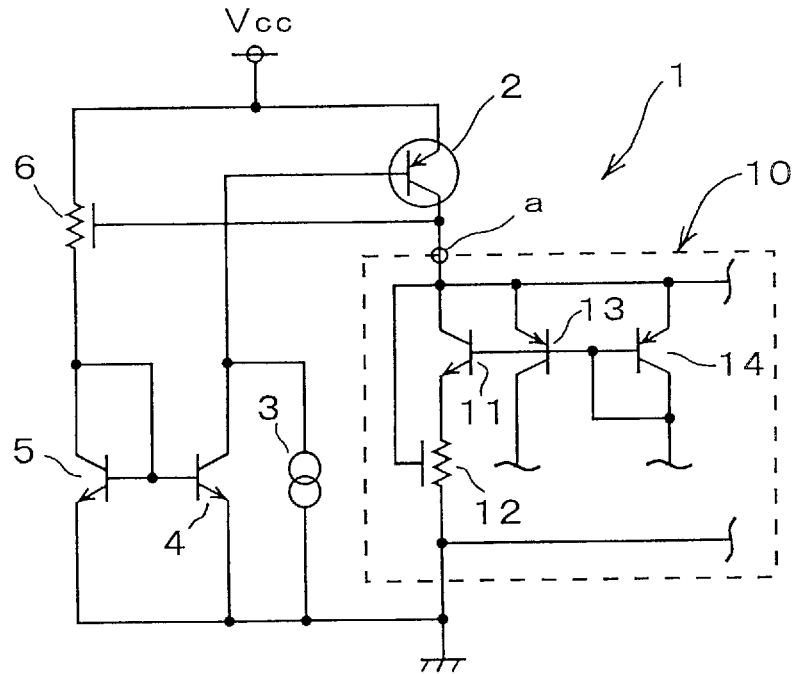
FIG. 1 is a circuit diagram of a semiconductor integrated circuit according to the first embodiment of the present invention.

FIG. 1 is a circuit diagram of a semiconductor integrated circuit according to the first embodiment of the present invention. As shown in FIG. 1 the semiconductor IC 1 includes a pnp transistor 2 having a collector wall ring, a constant current supply 3, npn transistors 4 and 5, p diffused resistor 6, and an electronic circuit 10 formed from a semiconductor integrated circuit. Note that this semiconductor IC 1 is a bipolar IC, and the collector wall ring functions as a collector wall.

The electronic circuit 10 includes npn transistor 11, p diffused resistor 12, and pnp transistors 13 and 14. The emitter of the npn transistor 11 is grounded through the p diffused resistor 12, and the base is grounded to the bases of the pnp transistors 13 and 14. The emitters of the pnp transistors 13 and 14 are grounded to the collector of the npn transistor 11, and the base and collector of the pnp transistor 14 are grounded.

Figure 10:
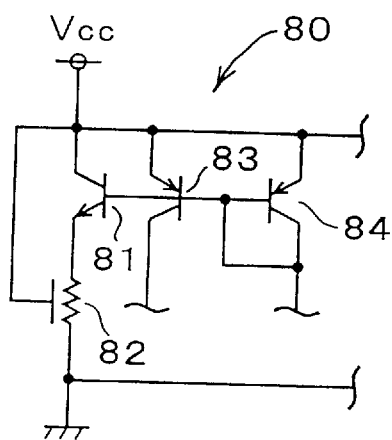
FIG. 10 is a circuit diagram of part of a prior art semiconductor integrated circuit (IC).

Note that for simplification only part of the total circuitry of the electronic circuit 10 is shown in the figures. The electronic circuit 10 is also built the same as the conventional bipolar semiconductor ICs 80 shown in FIGS. 10 to 12, and the npn transistor 11 of the present embodiment corresponds to the p diffused resistor 82 shown in FIG. 10, the pnp transistor 13 to the pnp transistor 83 in FIG. 10, and the pnp transistor 14 to the pnp transistor 84 in FIG. 10.

The emitter of the pnp transistor 2 is connected to the power supply terminal Vcc through which the dc power supply flows from an external source. The collector of the pnp transistor 2 is connected to the collector of the npn transistor 11 of the electronic circuit 10, and the connection between these is referenced as junction a, which functions as the power supply terminal to which the dc power supply is supplied in the electronic circuit 10.

The constant current supply 3 is connected between the base of the pnp transistor 2 and the ground to supply current sufficient to enable the pnp transistor 2 to operate in a saturated state to the base of the pnp transistor 2.

The collector of the npn transistor 4 is connected to the base of the pnp transistor 2, and the emitter of the npn transistor 4 is grounded. The base of the npn transistor 4 is connected to the base of the npn transistor 5, and this junction is connected to the collector of the npn transistor 5. The emitter of the npn transistor 5 is grounded, and the collector is connected through the p diffused resistor 6 to the power supply terminal Vcc. The n regions formed by the various n layers of p diffused resistors 6 and 12 are connected to the junction a as will be described in detail below.

The npn transistors 4 and 5 and p diffused resistor 6 form a starting circuit that flows the current from the constant current supply 3 as the base current of the pnp transistor 2. When the pnp transistor 2 is on, the pnp transistor 2 must operate in the saturation range to reduce the voltage drop between the emitter and collector. It is therefore necessary to flow current sufficient for the pnp transistor 2 to operate in the saturation range to the base of the pnp transistor 2. The constant current supply 3 is therefore set to provide a sufficient current supply to the base of the pnp transistor 2.

Figure 2:
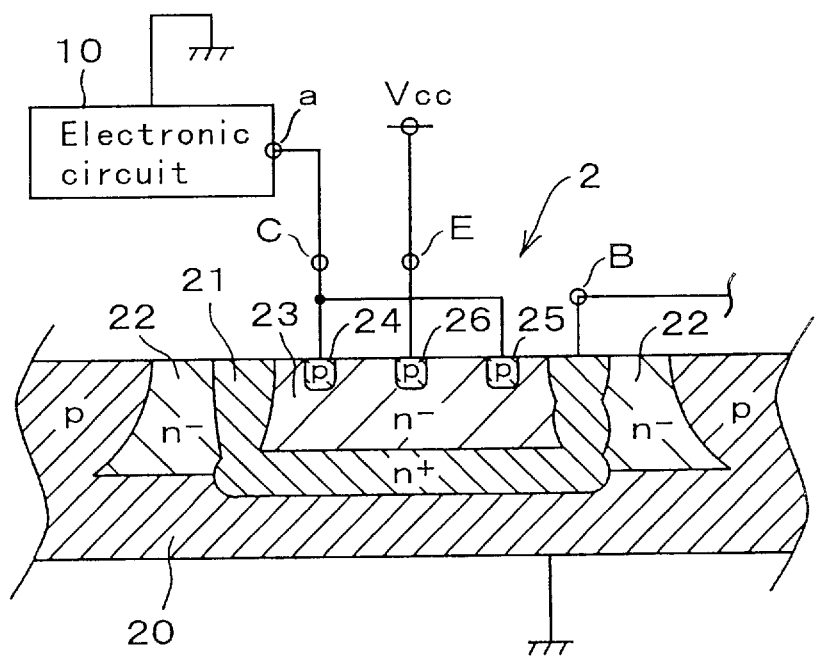
FIG. 2 is a cross section of the pnp transistor 2 area in FIG. 1 when a dc power supply is normally connected.

FIG. 2 is a cross section of the pnp transistor 2 area in FIG. 1 when a dc power supply is normally connected. As shown in FIG. 2 the pnp transistor 2 includes n⁻ epitaxial layers 22 and 23 and a collector wall ring 21 formed from an n⁺ layer on the p silicon substrate 20, p diffusion layers 24 and 25 forming the collector, and a p diffusion layer 26. The collector wall ring 21 and n⁻ epitaxial layers 22 and 23 form the base of the pnp transistor 2.

The collector wall ring 21 functions to lower the serial resistance of the collector and to decrease the parasitic pnp transistor effect that occurs between the silicon substrate and the collector wall ring 21. The collector wall ring 21 can therefore reduce the voltage drop caused by the pnp transistor 2 when the saturation voltage of the pnp transistor 2 is reduced and the pnp transistor 2 is on.

The p diffusion layers 24 and 25 are interconnected and form the collector that is connected to the junction a between the pnp transistor 2 and electronic circuit 10. When a dc power supply is normally connected, the p silicon substrate 20 is grounded and the p diffusion layer 26 that is the emitter is connected to the power supply terminal Vcc.

Figure 3:
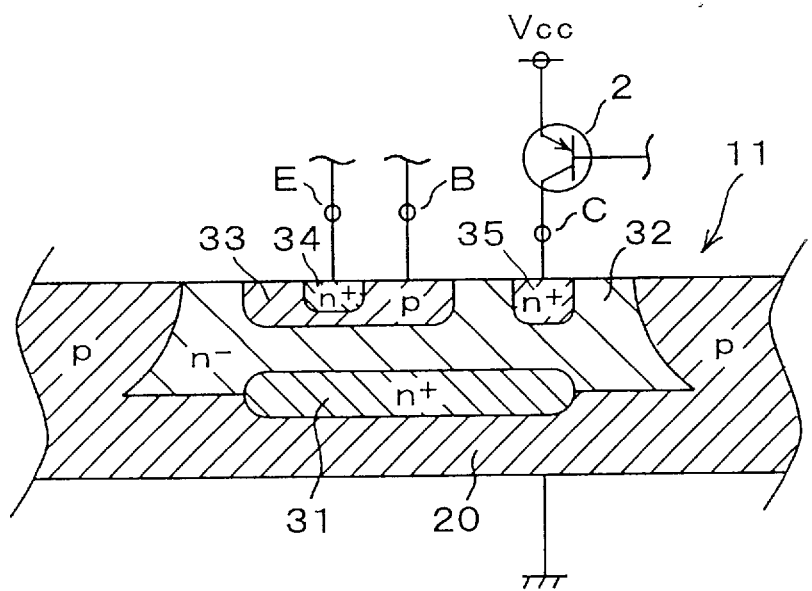
FIG. 3 is a cross section of the npn transistor 11 in FIG. 1 when a dc power supply is normally connected.

FIG. 3 is a cross section of the npn transistor 11 in FIG. 1 when a dc power supply is normally connected. Note that like parts in FIG. 2 and FIG. 3 are indicated with like reference numbers. As shown in FIG. 3 the npn transistor 11 comprises an n⁺ implantation layer 31 and an n⁻ epitaxial layer 32 formed in a p silicon substrate 20, a p diffusion layer 33 forming the base, an n⁺ diffusion layer 34 forming the emitter, and an n⁺ diffusion layer 35 forming the contact of the collector. The n⁺ diffusion layer 35 is connected to the collector of the pnp transistor 2, the p diffusion layer 33 forming the base is connected to the bases of the pnp transistors 13 and 14, and the n⁺ diffusion layer 34 forming the emitter is connected to the p diffused resistor 12. When the dc power supply is normally connected, the p silicon substrate 20 is thus grounded.

Figure 4:
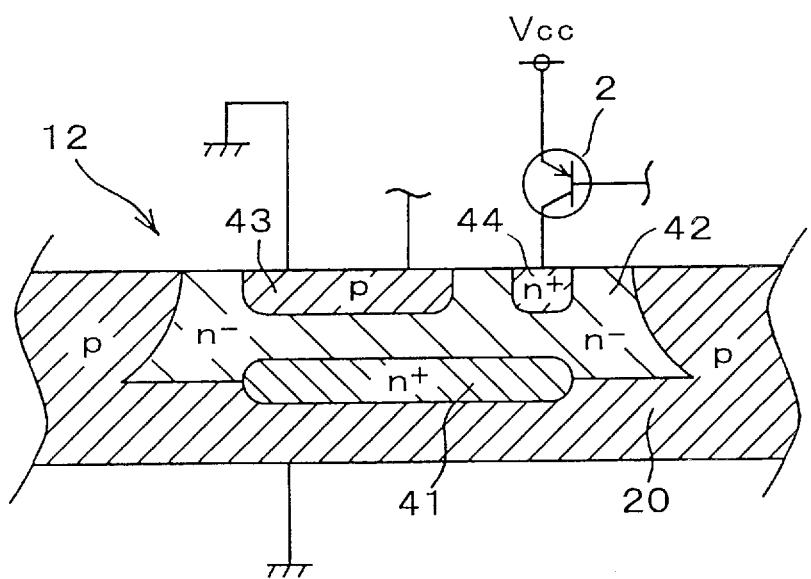
FIG. 4 is a cross section of the p diffused resistor 12 in FIG. 1 when a dc power supply is normally connected.

FIG. 4 is a cross section of the p diffused resistor 12 in FIG. 1 when a dc power supply is normally connected. Note that like parts in FIG. 2 and FIG. 4 are indicated with like reference numbers. As shown in FIG. 4 the p diffused resistor 12 includes an n⁺ implantation layer 41, an n⁻ epitaxial layer 42, a p diffusion layer 43 forming the resistor, and an n⁺ diffusion layer 44 on the p silicon substrate 20. The n⁺ diffusion layer 44 is connected to the collector of the pnp transistor 2, and the p silicon substrate 20 is grounded. Two terminals are disposed to the p diffusion layer 43, and the resistance between these two terminals is the resistance of the p diffused resistor 12. Of the two terminals disposed to the p diffusion layer 43, one is connected to the emitter of the npn transistor 11, and the other is grounded.

Figure 5:
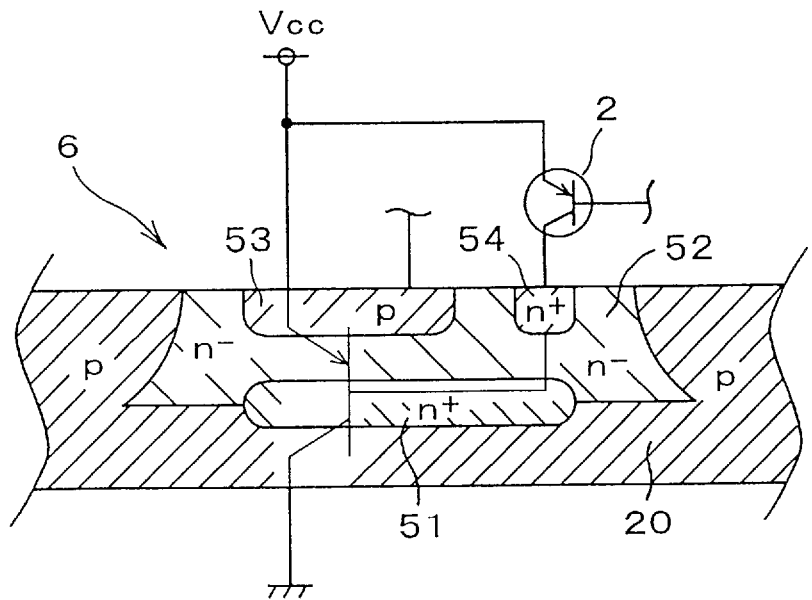
FIG. 5 is a cross section of the p diffused resistor 6 in FIG. 1 when a dc power supply is normally connected.

FIG. 5 is a cross section of the p diffused resistor 6 in FIG. 1 when a dc power supply is normally connected. Note that like parts in FIG. 2 and FIG. 5 are indicated with like reference numbers. As shown in FIG. 5 the p diffused resistor 12 includes an n⁺ implantation layer 51, an n⁻ epitaxial layer 52, a p diffusion layer 53 forming the resistor, and an n⁺ diffusion layer 54 formed on a p silicon substrate 20. The n⁺ diffusion layer 54 is connected to the collector of the pnp transistor 2, and the p silicon substrate 20 is grounded. Two terminals are disposed on the p diffusion layer 53, and the resistance between these two terminals is the resistance of the p diffused resistor 6. Of the two terminals disposed on the p diffusion layer 53, one is connected to the power supply terminal Vcc, and the other is connected to the collector and base of the npn transistor 5 and to the base of the npn transistor 4.

Note that a parasitic pnp transistor is formed by the p diffusion layer 53, the p silicon substrate 20, and the n region including the n⁺ implantation layer 51, n⁻ epitaxial layer 52, and the n⁺ diffusion layer 54. The n⁺ diffusion layer 54 constituting the base terminal of this parasitic pnp transistor is connected to the power supply terminal Vcc through the pnp transistor 2, and the voltage between the emitter and collector when the pnp transistor 2 is on is lower than the voltage between the emitter and base of this parasitic pnp transistor. As a result, the emitter voltage is lower than the base voltage in the parasitic pnp transistor, preventing the parasitic pnp transistor from becoming on and thereby making it possible to reduce the leakage current from the power supply caused by the parasitic pnp transistor.

What happens when a dc power supply is connected with the polarity reversed to the semiconductor IC 1 of FIG. 1 is described below.

Figure 6:
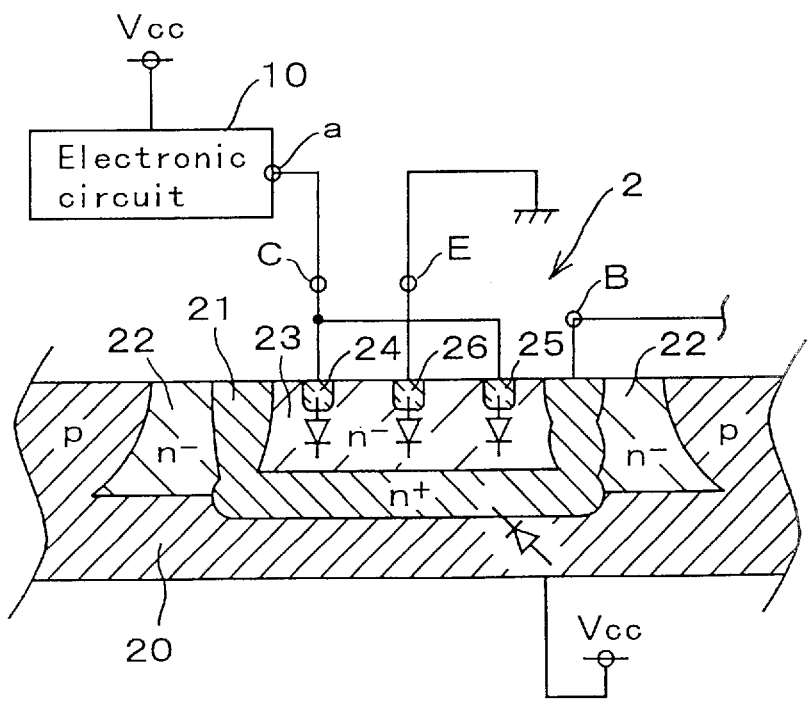
FIG. 6 is a cross section of the pnp transistor 2 chip area when a dc power supply is connected with the polarity reversed.

FIG. 6 is a cross section of the pnp transistor 2 chip area when a dc power supply is connected with the polarity reversed. Note that like parts are referenced by like reference numbers in FIG. 2 and FIG. 6, and further description thereof is omitted.

When a dc power supply is connected in reverse polarity, the p silicon substrate 20 is connected to the power supply terminal Vcc, all grounded components of the electronic circuit 10 are connected to the power supply terminal Vcc, and the emitter of the pnp transistor 2 is grounded.

When thus connected, a pn junction diode is formed by the p silicon substrate 20 and the n region including the collector wall ring 21 and the n⁻ epitaxial layers 22 and 23, and pn junction diodes are formed between the p diffusion layers 24 to 26 and the n region including the collector wall ring 21 and the n⁻ epitaxial layers 22 and 23. However, the grounded p diffusion layer 26 forms the anode of the diode, and the collector wall ring 21 and n region including the n⁻ epitaxial layers 22 and 23 form the cathode of the diode. As a result, the p silicon substrate 20 does not short-circuit with the p diffusion layer 26, the p silicon substrate 20 and p diffusion layer 24 do not short-circuit, and the p silicon substrate 20 and p diffusion layer 25 do not short-circuit.

Figure 11:
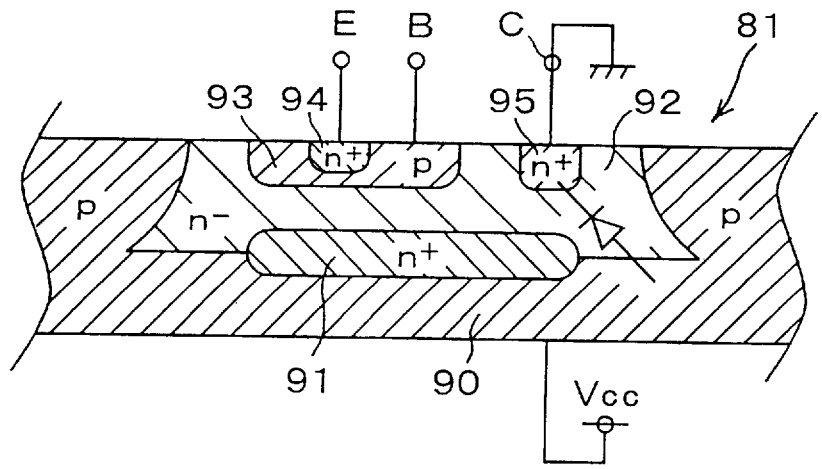
FIG. 11 is a cross section of the prior art semiconductor chip including npn transistor 81 when a dc power supply is connected with the polarity reversed.
Figure 12:
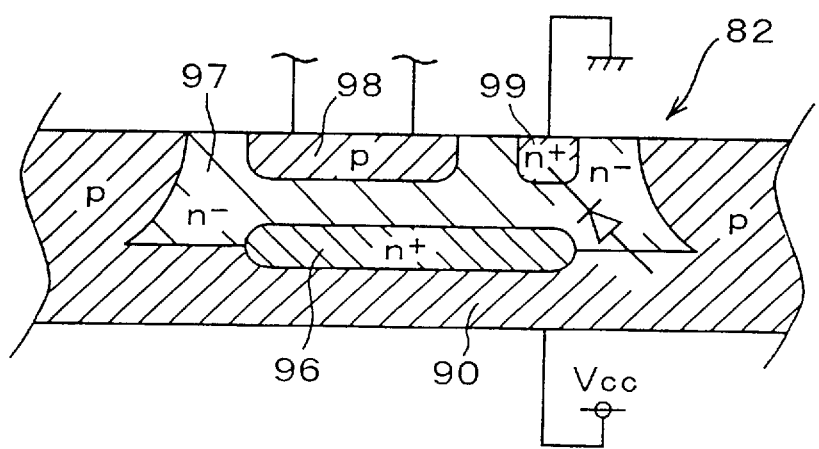
FIG. 12 is a cross section of the prior art semiconductor chip area of the p diffused resistor 82 when a dc power supply is connected with the polarity reversed.

Thus, the diodes formed in the npn transistor 11 and p diffused resistor 12 of the electronic circuit 10 similarly to the npn transistor 81 and p diffused resistor 82 formed as shown in FIG. 11 and FIG. 12 prevent the power supply terminal Vcc connected to the collector of the pnp transistor 2 from being grounded through the emitter of the pnp transistor 2 when a dc power supply is connected with the polarity reversed to a semiconductor IC according to the present invention.

When a dc power supply is connected with the polarity reversed, therefore, the diodes formed in the npn transistor 11 and p diffused resistor 12 of the electronic circuit 10 prevent the junction a from being grounded by the pnp transistor 2 even if the power supply terminal Vcc is connected to the junction a to the electronic circuit 10.

Figure 7:
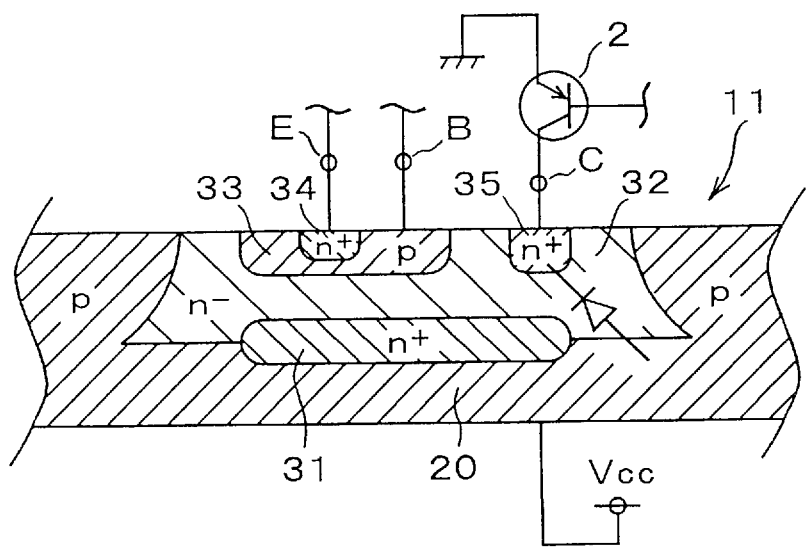
FIG. 7 is a cross section of the npn transistor 11 chip area when a dc power supply is connected with the polarity reversed.

FIG. 7 is a cross section of the npn transistor 11 chip area when a dc power supply is connected with the polarity reversed. Note that like parts are referenced by like reference numbers in FIG. 3 and FIG. 7, and further description thereof is omitted.

As shown in FIG. 7, when a dc power supply is connected with the polarity reversed, the p silicon substrate 20 is connected to the power supply terminal Vcc, and the emitter of the pnp transistor 2 is grounded.

Note that the power supply terminal Vcc is connected to the n⁺ diffusion layer 35 by the forward bias diode formed between the p silicon substrate 20 and the n region including the n⁺ implantation layer 31, n⁻ epitaxial layer 32, and n⁺ diffusion layer 35. However, the collector of the pnp transistor 2 is connected to the n⁺ diffusion layer 35, and the n⁺ diffusion layer 35 is not grounded by the pnp transistor 2.

Figure 8:
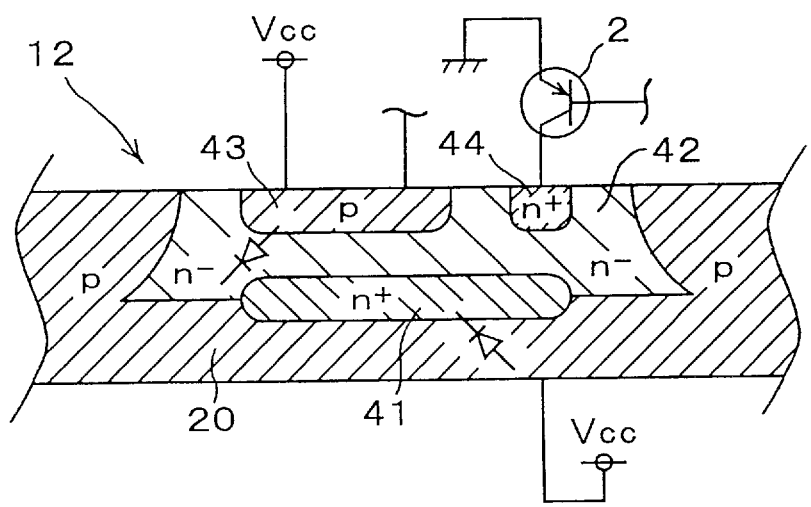
FIG. 8 is a cross section of the p diffused resistor 12 chip area when a dc power supply is connected with the polarity reversed.

FIG. 8 is a cross section of the p diffused resistor 12 chip area when a dc power supply is connected with the polarity reversed. Note that like parts are referenced by like reference numbers in FIG. 4 and FIG. 8, and further description thereof is omitted.

As shown in FIG. 8, when a dc power supply is connected with the polarity reversed, the p silicon substrate 20 is connected to the power supply terminal Vcc, and of the two terminals disposed to the p diffusion layer 43, the grounded terminal is connected to the power supply terminal Vcc and the emitter of the pnp transistor 2 is grounded.

Note that the power supply terminal Vcc is connected to the n⁺ diffusion layer 44 by the forward bias diode formed between the p silicon substrate 20 and the n region including the n⁺ implantation layer 41, n⁻ epitaxial layer 42, and n⁺ diffusion layer 44, and the forward bias diode formed between the p diffusion layer 43 and the n region comprising the n⁺ implantation layer 41, n⁻ epitaxial layer 42, and n⁺ diffusion layer 44. However, the collector of the pnp transistor 2 is connected to the n⁺ diffusion layer 44, and the n⁺ diffusion layer 44 is not grounded by the pnp transistor 2.

Figure 9:
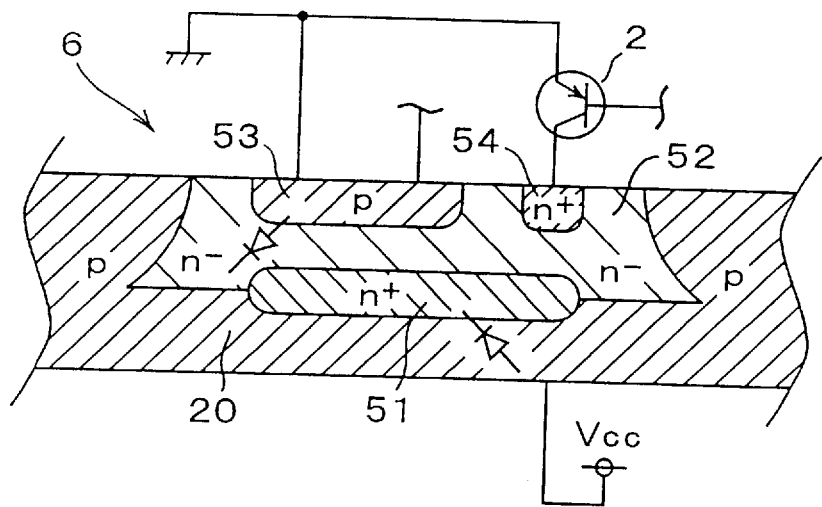
FIG. 9 is a cross section of the p diffused resistor 6 chip area when a dc power supply is connected with the polarity reversed.

FIG. 9 is a cross section of the p diffused resistor 6 chip area when a dc power supply is connected with the polarity reversed. Note that like parts are referenced by like reference numbers in FIG. 5 and FIG. 9, and further description thereof is omitted.

As shown in FIG. 9, when a dc power supply is connected with the polarity reversed, the p silicon substrate 20 is connected to the power supply terminal Vcc, and of the two terminals disposed to the p diffusion layer 53, the terminal connected to the power supply terminal Vcc and the emitter of the pnp transistor 2 are grounded.

Note that the power supply terminal Vcc is connected to the n⁺ diffusion layer 54 by the forward bias diode formed between the p silicon substrate 20 and the n region including the n⁺ implantation layer 51, n⁻ epitaxial layer 52, and n⁺ diffusion layer 54. However, the collector of the pnp transistor 2 is connected to the n⁺ diffusion layer 54, and the n⁺ diffusion layer 54 is not grounded by the pnp transistor 2. In addition, the grounded terminal of the p diffusion layer 33 is prevented from being connected to the power supply terminal Vcc by the diode formed by the p diffusion layer 53 and the n region constituting n⁺ implantation layer 51, n⁻ epitaxial layer 52, and n⁺ diffusion layer 54.

As described above, the semiconductor IC 1 according to the first embodiment of the present invention disposes a pnp transistor 2 including a collector wall ring between the power supply terminal Vcc and the junction a functioning as a power supply terminal supplying a dc power supply to an electronic circuit 10 formed from a semiconductor IC, supplies a dc power supply to the junction a through pnp transistor 2, and connects a constant current supply 3 for flowing to the base of the pnp transistor 2 a base current of sufficient capacity to enable the pnp transistor 2 to operate in a saturated condition.

As a result, when a dc power supply is normally connected to the semiconductor IC 1, it is possible to minimize the voltage drop caused by the pnp transistor 2, and the current leakage from the power supply caused by the parasitic pnp transistor formed inside the p diffused resistor 6 can be reduced. When a dc power supply is connected with the polarity reversed, grounding of the junction a can be prevented by the pnp transistor 2 even if the power supply terminal Vcc and the junction a of the electronic circuit 10 are short-circuited. As a result, even if the dc power supply is connected with polarity reversed, it is possible to prevent the power supply terminal Vcc from being grounded inside the semiconductor integrated circuit, and damage to the semiconductor integrated circuit can be prevented.

As will be known from the above description of the preferred embodiment, in the semiconductor integrated circuit of the present invention a dc power supply flows from an external source to the various elements of a bipolar IC through a pnp transistor with a base current of capacity sufficient to enable operation in the saturation range. More specifically, the semiconductor IC of the present invention supplies dc power through the pnp transistor disposed in the bipolar IC to the collector of an npn transistor and the n region of a p diffused resistor in the bipolar IC to which the dc power is applied from an external source, and the pnp transistor prevents damage to the components when a dc power supply is connected in reverse polarity. Furthermore, a collector wall is used as the pnp transistor, a constant current supply is connected to the base of the pnp transistor, and a base current of capacity sufficient to enable operation in the saturation range is supplied to the pnp transistor.

As a result, when a dc power supply is normally connected, it is possible to reduce the current leakage from the power supply caused by the parasitic pnp transistor formed inside the p diffused resistor, the voltage drop caused by the pnp transistor can be minimized, and a pnp transistor voltage drop caused when the dc power is supplied through a pnp transistor to the various elements of the bipolar IC can be prevented. In addition, when a dc power supply is connected with the polarity reversed, it is possible to prevent the power supply terminal Vcc through which a dc power supply is applied from an external source from being grounded inside the semiconductor IC, and damage to the semiconductor IC can be prevented. As a result, the reliability of the semiconductor IC can be improved.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A bipolar semiconductor integrated circuit comprising:

a DC power supply port to which an external DC power source is connected to supply a DC power to said bipolar semiconductor IC, a pnp transistor, an emitter of which is connected to said DC power supply port and a collector of which is connected to one element of said bipolar semiconductor IC, and a constant current circuit for turning said pnp transistor on and controlling a base current of said pnp transistor to a constant level causing operation in the saturation range of said pnp transistor.

2. The semiconductor integrated circuit of claim 1 wherein said pnp transistor supplies the dc power from the external source to an n region of a p diffused resistor and to a collector of an npn transistor of said bipolar IC.

3. The semiconductor integrated circuit of claim 1 wherein said pnp transistor is provided in the bipolar IC.

4. The semiconductor integrated circuit of claim 1 wherein said pnp transistor acts as a collector wall.

* * * * *